United States Patent
On et al.

(10) Patent No.: US 7,492,849 B2
(45) Date of Patent: Feb. 17, 2009

(54) SINGLE-VCO CDR FOR TMDS DATA AT GIGABIT RATE

(75) Inventors: Au Yeung On, Singapore (SG); Ding Yong, Brisbane (AU); Rajinder Singh, Singapore (SG)

(73) Assignee: FTD Solutions Pte., Ltd., Singapore (SG)

( * ) Notice: Subject to any disclaimer, the term of this patent is extended or adjusted under 35 U.S.C. 154(b) by 595 days.

(21) Appl. No.: 11/126,030

(22) Filed: May 10, 2005

(65) Prior Publication Data
US 2006/0256909 A1  Nov. 16, 2006

(51) Int. Cl.
*H03D 3/24* (2006.01)

(52) U.S. Cl. .................. 375/376; 375/375; 375/374; 375/373; 331/2; 331/11; 327/158; 713/500

(58) Field of Classification Search .......... 375/376, 375/375; 327/158; 331/2; 713/500
See application file for complete search history.

(56) References Cited

U.S. PATENT DOCUMENTS

| | | | |
|---|---|---|---|
| 5,008,636 A * | 4/1991 | Markinson et al. | 331/2 |
| 5,905,769 A * | 5/1999 | Lee et al. | 375/376 |
| 6,373,911 B1 * | 4/2002 | Tajima et al. | 375/375 |
| 6,442,225 B1 * | 8/2002 | Huang | 375/376 |
| 6,545,507 B1 | 4/2003 | Goller | 326/93 |
| 6,587,525 B2 | 7/2003 | Jeong et al. | 375/354 |
| 2004/0042577 A1 | 3/2004 | Sumiyoshi et al. | 375/368 |
| 2004/0210790 A1 * | 10/2004 | Moon et al. | 713/500 |
| 2007/0115036 A1 * | 5/2007 | Lee | 327/158 |

FOREIGN PATENT DOCUMENTS

JP  2001203676  7/2001

OTHER PUBLICATIONS

"A 9.9 G-10.8 Gb/s Rate-Adaptive Clock and Data-Recovery With No External Reference Clock for WDM Optical Fiber Transmission," Noguchi, et al., Digest of Tech. Papers: IEEE Int'l Solid-State Cir. Conf., ISSCC-2002, vol. 1, pp. 252-465.

* cited by examiner

*Primary Examiner*—Sudhanshu C Pathak
(74) *Attorney, Agent, or Firm*—Saile Ackerman LLC; Stephen B. Ackerman; Billy Knowles (57) ABSTRACT

A clock and data recovery circuit has a voltage controlled oscillator that provides a clocking signal synchronized to a received serialized data. A multiple phase generator converts the clocking signal to a plurality of multiple phased clocking signals. A data capture device acquires the serialized data with each of the plurality of multiple phased clocking signals to create multiple phased data signals. A phase detector determines if the clocking signal is in phase with the recovered serialized data and providing a lead signal and a lag signal indicating whether the clocking signal is in phase with the recovered serialized data. A frequency initializing device assists acquisition of lock of the voltage controlled oscillator to a reference clock signal. A recovered data selector selects which of the multiple phased data signals are to be transferred to external circuitry for further processing.

22 Claims, 11 Drawing Sheets

SINGLE-VCO CDR FOR TMDS DATA AT GIGABIT RATE

BACKGROUND OF THE INVENTION

1. Field of the Invention

This invention relates generally to a circuits and systems for the recovery and regeneration of data and synchronizing clock signals received from a serial transmission channel. More particularly this invention relates to circuits and systems for recovery and regeneration of data and synchronizing clock signals while overcoming skew and jitter within the transmitted data and clock signals.

2. Description of Related Art

As commercial and cable television has migrated to high definition digital transmission, equipment manufacturers have cooperated to create the specifications such as the High-Definition Multimedia Interface (HDMI™) developed by Hitachi, Ltd., Matsushita Electric Industrial Co., Ltd., Philips Consumer Electronics, International B.V., Silicon Image, Inc., Sony Corporation, and Thomson Inc.

Toshiba Corporation, and the digital visual interface (DVI) specification, as promulgated by the Digital Display Working Group, to describe transmitting digital television audiovisual signals from DVD players, cable television set-top boxes and other audiovisual sources to television sets, projectors and other video displays. DVI can carry high quality multi-channel audio data and can carry all standard and high-definition consumer electronics video formats. Further, HDMI™ can also carry control and status information in both directions.

Figure 1:
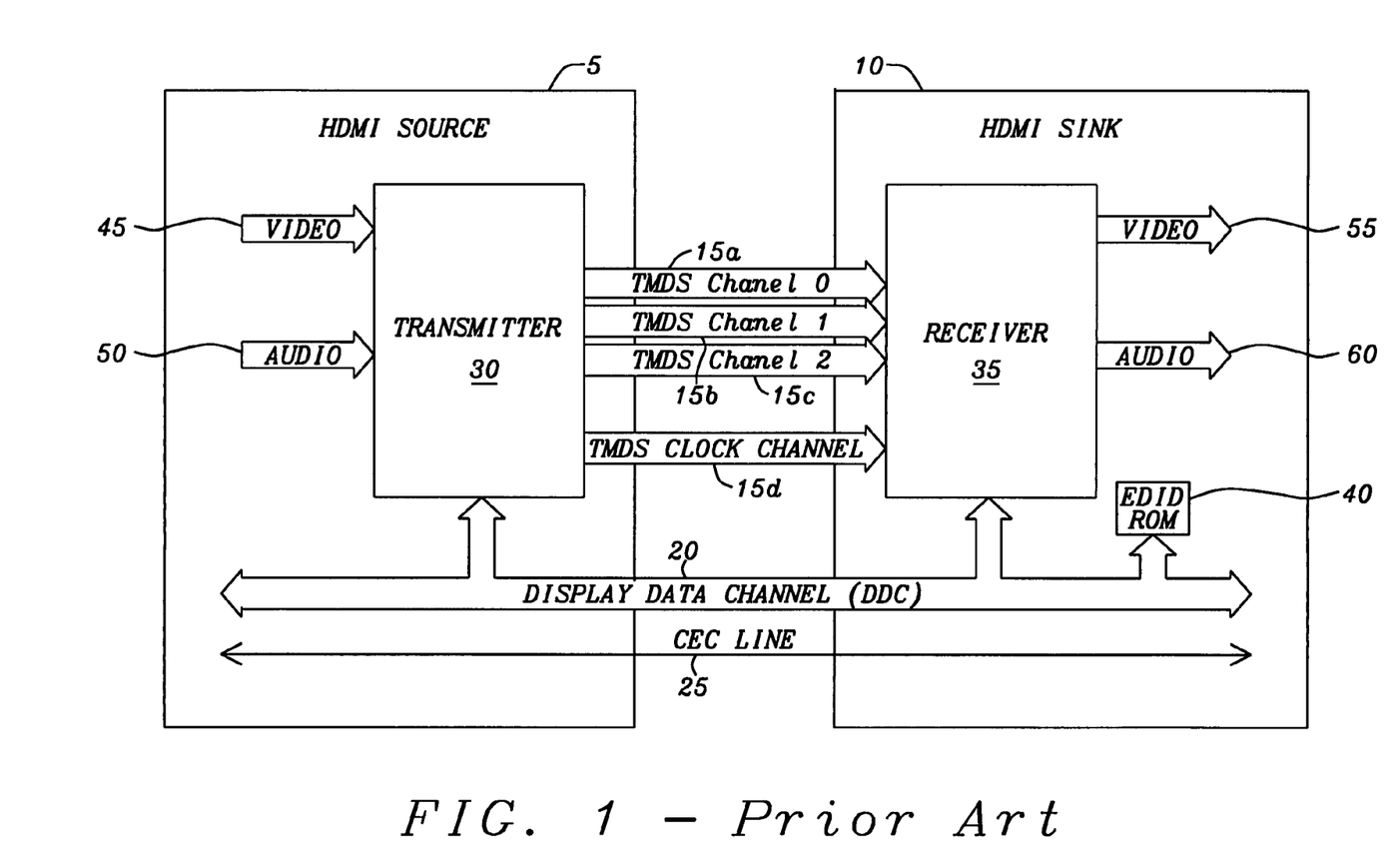
FIG. 1 is a functional block diagram of the High Definition Multimedia Interface (HDMI™) architecture of the prior art.

Referring to FIG. 1, HDMI™ system architecture is defined to consist of Sources 5 and Sinks 10. The HDMI™ source device 5 communicates with the over HDMI™ cable and connectors. The HDMI™ cable and connectors carry four differential pairs that make up the Transition Minimized Differential Signaling (TMDS) data and clock channels 15a, 15b, 15c, and 15d. These channels 15a, 15b, 15c, and 15d are used to carry video, audio and auxiliary data. In addition, HDMI™ cables and connectors carry a digital data (DDC) channel 20. The DDC 20 is used for configuration and status exchange between a single Source 5 and a single Sink 10 by reading the Enhanced Extended Display Identification Data (EDID) from the EDID read only memory 40 to retrieve the Sink's configuration and/or capabilities.

The optional Consumer Electronic Control (CEC) line 55 provides high-level control functions between all of the various audiovisual products in a user's environment.

Video 45, audio 50 and auxiliary data is transmitted across the three TMDS data channels 15a, 15b, and 15c. The video pixel clock is transmitted on the TMDS clock channel 15d and is used by the receiver 35 as a frequency reference for data recovery on the three TMDS data channels 15a, 15b, and 15c. Video data is carried as a series of 24-bit pixels on the three TMDS data channels 15a, 15b, and 15c. TMDS encoding converts the 8 bits per channel into the 10 bit DC-balanced, transition minimized sequence which is then transferred by the transmitter 30 serially across the pair at a rate of 10 bits per pixel clock period to the receiver 35. The receiver 35 acquires and recovers the transmitted data and the synchronizing clock of the data to restore the received video data 55 and the audio data 60.

Figure 2:
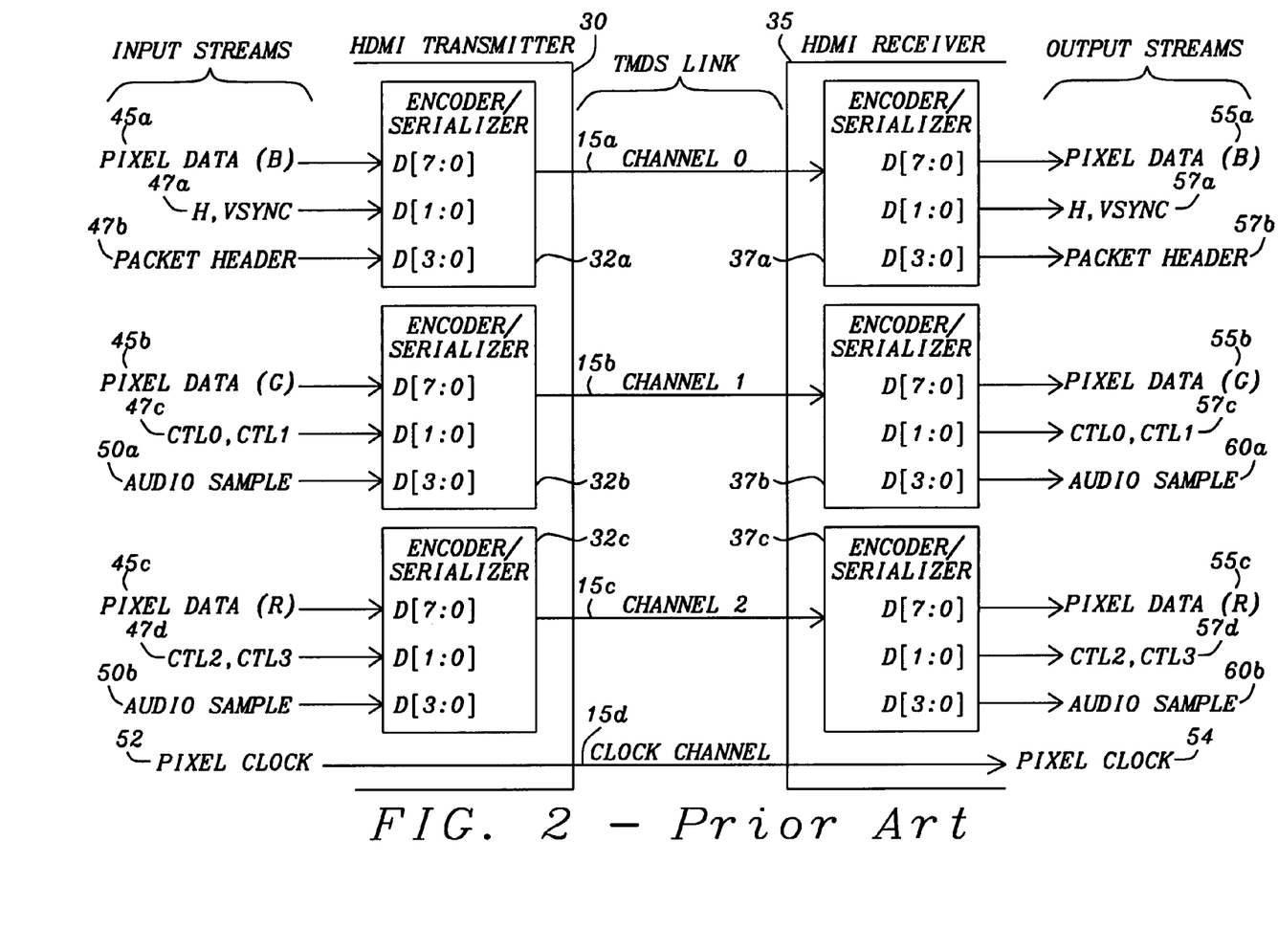
FIG. 2 is a functional block diagram of the transmitter and receiver of the High Definition Multimedia Interface (HDMI™) architecture of the prior art as shown in FIG. 1.

Video pixel rates can range from 25 MHz to 165 MHz. Video formats with rates below 25 MHz (e.g. 13.5 MHz for NTSC) can be transmitted using a pixel-repetition scheme. Up to 24 bits per pixel are transferred. In order to transmit audio and auxiliary data across the TMDS channels 15a, 15b, and 15c, HDMI™ uses a packet structure. In order to attain the higher reliability required of audio and control data, the data is protected with an error correction code and is encoded using a special error reduction coding to produce the 10-bit word that is transmitted The transmitter 30, as shown in FIG. 2 has three encoder and serializers 32a, 32b, and 32c that receive the video components 45a, 45a, and 45c, the audio components 50a, 50b, and 50c, and the control signals 47a, 47b, 47c, and 47d and convert the signals into the three TMDS link channels 15a, 15b, and 15c. The pixel clock 52 is transmitted on the clock channel 15d to be the received pixel clock 54. It should be noted that the pixel clock 52 is the clock for the complete pixel and the bits of the data packets transmitted on the TMDS link channels 15a, 15b, and 15c are transmitted at a multiple of 10 greater than the pixel clock. The data packets are synchronized by a clock that has a frequency that is ten times greater than the pixel clock 52. For pixel rates at 165 MHz, the serialized bits of the packet data must be transmitted at a rate of 1.65 Gb/S.

To ensure that correct capture of the video and audio data 55 and 60 of FIG. 1, the HDMI™ and DVI specifications include standards for inter-conductor data skew and clock jitter. Correct data capture is ensured at receiving end, in one approach, by data over-sampling followed by selecting a bit from over-sampled bits by decision logic as described in U.S. Pat. No. 5,905,769 (Lee, et al.) and U.S. Pat. No. 6,587,525 (Jeong, et al.). Lee, et al. describes a system that receives a multi-channel digital serial encoded signal and converts the signal into a synchronized set of binary characters. A charge pump phase-locked loop receives a transmitted reference clock and derives a multi-phase clock from the reference clock. The multi-phase clock is used to control a plurality of multi-bit block assembly circuits. Each assembly circuit receives one channel of the digital signal and produces a multi-bit block or character. The multi-bit block assembly circuit includes an oversampler, a digital phase-locked loop and a byte synchronizer. The oversampler oversamples the received digital signal under control of the multiphase clock and produces a sequence of oversampled binary data. The digital phase-locked loop receives the oversampled data and selects samples from it depending on the skew characteristics of the sample. The byte synchronizer assembles a sequence of selected bits into a bit block, or character. An interchannel synchronizer receives as input the characters produced by each of the multi-bit block assembly circuits, and selectively delays output of the received characters in order to synchronize the characters of each channel with one another.

Jeong, et al. describes a system for transmission and recovery of original digital data. The system includes an encoder, a transmitter, a receiver, a decoder, and an analog phase locked loop. The analog phase locked loop supplies a senders clock to the transmitter and a receiver's clock to the receiver. The transmit clock frequency is a first integer multiple of the system clock frequency, and the receiver clock frequency is a second integer multiple of the transmit clock frequency within 0.1% tolerance. In a normal flow situation, data frames are output by the receiver in alternate cycles of the system clock. In an overflow situation, data frames are output by the receiver in consecutive cycles of the system clock. In an underflow situation, data frames are output by the receiver in non consecutive or alternate cycles of the system clock.

In the over-sampling technique, the decision logic is realized by use of a digital phase lock loop (DPLL) whose phase-pointer is adjusted based on transition (boundary) of the input data so that the phase-pointer always points at the center bit of the over-sampled bits. This approach exhibits deteriorated phase quantization error due to the increased phase interval.

When the phase-pointer changes its phase due to change of data boundary, some bits may be selected twice and some may get missed. Therefore careful correction is necessary to remove the repeated bit or add the missing bit, which increases design complexity. Besides, as the clocks and data don't necessarily remain synchronized, error may occur during the over-sampling due to metastability effect. This may cause wrong decision for phase selection in DPLL and result in high bit error rate (BER).

The advantages of the over-sampling technique for data recovery include the high bandwidth of the DPLL to cope with high data rate of the transmitted TMDS data. The over-sampling technique is relatively easy to implement. It employs a small portion of analog circuitry is mostly digital logic circuitry implemented by using standard cells of a typical application specific integrated circuit process flow.

Alternately, the over-sampling technique has a large phase quantization error that requires discrete adjustment. Additional data correction logic is required to correct recovered data error due to the quantization error. Further the over-sampling as described above may cause the sampling faults requiring additional error correction complexity. This added complexity contributes to a large power consumption of the circuits employing the over-sampling technique.

An alternative to the over-sampling technique is the tracking-type of clock and data recovery circuit. The tracking type clock and data recovery circuit is widely used for data rates in the gigabit per second range. The tracking type clock and data recovery circuit applies a delay to the clock for synchronization between data and clock. One application example is given in Japanese Patent Publication JP2001/203676A (Kazutaka, et al.). Kazutaka, et al. provides a circuit in a chip for receiving data synchronously with a clock that takes synchronization between the data and the clock with high accuracy by delaying only the clock without delaying the data. The circuit synchronizes the data and the clock with a first circuit that detects a phase shift between an input data signal and a clock signal. A second circuit converts the detected phase shift into a control voltage for a delay time. A third circuit produces a delay in response to the control voltage to delay the clock and to produce a sampling clock. A fourth circuit receives the input signal in the timing of the sampling clock. Kazutaka, et al. employs the well known Alexander phase detector for synchronization of the recovered clock and data. It is an acceptable approach with reasonable bit error rate at low data rate and relatively easy to achieve high loop bandwidth using voltage controlled delay line for data/clock synchronization; there are no quantization error and Less Sampling Faults.

The tracking-type of clock and data recovery circuit requires very sophisticated control circuitry for the voltage controlled delay line to ensure the sufficient delay variation range for variable data rate used in the TMDS link for applications like DVI or HDMI™. Error or jitter in edge spacing is introduced because of mismatch between the delay lines and their load capacitances. This error or jitter requires large devices and careful layout. Further, the tracking-type of clock and data recovery circuit has less tolerance to asymmetric jitter.

"A 9.9 G-10.8 Gb/S Rate-Adaptive Clock and Data-Recovery with No External Reference Clock for WDM Optical Fiber Transmission", Noguchi, et al., Digest of Technical Papers: IEEE International Solid-State Circuits Conference, ISSCC-2002, 2002, Volume: 1, pp.: 252-465 describes a 9.9-10.8 Gb/s rate adaptive clock and data recovery circuit with 1:16 DMUX. A dual-input voltage-controlled oscillator incorporates a fast and a slow tracking loop with a DC gain enhancer.

U.S. Patent Application 2004/0210790 (Moon et al.) describes a 0.6-2.5 GBaud CMOS tracked 3× over-sampling clock/data recovery. A wide-range multiphase delay-locked loop (DLL) is used for generation of the multiphase clocks for a serializer in the transmitter. A tracked 3× over-sampling technique with dead-zone phase detection is incorporated in the receiver for clock/data recovery in the presence of excessive jitter and inter-symbol interference (ISI). A voltage-controlled oscillator (VCO), based on a folded starved inverter is used for the clock recovery.

U.S. Patent Application 2004/0042577 (Sumiyoshi et al.) teaches a regenerator circuit extracts proper signals out of signals that have jitter and are skewed. The most stable data rows are selected out of data rows obtained by over-sampling. A serial data regenerator circuit stores serial data as received for two system clocks, compares special character signals used in transmission with the data as stored for two system clocks, and determines positions (shift numbers) where patterns of the data match the special character signal. Correction for skews is implemented by sampling the data on the basis of information on the positions where matching is determined. Correction for jitter and skew is accomplished by three-times over-sampling serial data as received, dividing the serial data as oversampled into three edge groups, detecting a shift number matching special characters for each of the groups by the process described, selecting an edge group undergoing the least change in shift number, and regenerating the serial data from the edge group.

U.S. Pat. No. 6,545,507 (Goller) provides a fast locking clock and data recovery circuit (CDR) with high jitter tolerance and elimination of effects caused by metastability. The CDR circuit provides a fast locking (e.g., within 1.5 sync bit times or the first data transition) clock and data recovery. The CDR circuit takes multiple (e.g., 8) phases of the local clock, which are offset (e.g., by 45 degrees), and uses the multiple phases to latch the state of data at multiple times, and uses the latched data to determine which of the multiple phases captured a data transition. The CDR circuit compares the indicated phase to the phase used to capture a previous data transition and uses such information to produce a stable selection of a clock phase. The selected clock phase is then employed to provide a recovered clock and data signals in association with the incoming serial data stream. The recovered clock and data signals are independent of jitter and free of metastable conditions.

SUMMARY OF THE INVENTION

An object of this invention is to provide a communication system that has clock and data recovery circuit which recovers transmitted data and a synchronizing clock, where the frequency of the clock varies widely over a frequency spectrum.

Another object of this invention is to provide a clock and data recovery circuit that uses a voltage controlled oscillator to track the data.

Further, another object of this invention is to provide a clock and data recovery circuit that has no phase quantization error.

Even further, another object of this invention is to provide a clock and data recovery circuit that over-samples bits for better jitter tolerance particularly to asymmetric jitter.

To accomplish at least one of these objects a communication system transmits and receives a synchronizing clock and serialized digital data over a communication medium. The communication system includes a receiver with a clock and data recovery circuit for recovery of the synchronizing clock and serialized digital data from a received communication signal. The clock and data recovery circuit has a data capture device which receives the communication signal and recovers the serialized digital data. A voltage controlled oscillator is in communication with the data capture device to provide an oscillator clocking signal synchronized to the received communication signal.

A multiple phase generator is in communication with the voltage controlled oscillator to receive and convert the oscillator clocking signal to a plurality of multiple phased clocking signals, each signal being phase shifted from the oscillator clocking signal. The multiple phase generator is in communication with the data capture device to receive the plurality of multiple phased clocking signals, the data capture device acquiring the serialized digital data with each of the plurality of multiple phased clocking signals to create a plurality of acquired multiple phased data signals.

A phase detector is in communication with the data capture device to receive the recovered serialized data and in communication with the multiple phase generator to acquire the plurality of multiple phased clocking signals, the phase detector determining if the oscillator clocking signal is in phase with the recovered serialized data and providing a lead signal and a lag signal indicating whether the oscillator clocking signal is in phase with the recovered serialized data. A low pass filter is in communication with the phase detector/charge pump to receive and low pass filter the lead lag error signal to develop a frequency adjusting voltage for the voltage controlled oscillator.

The clock and data recovery circuit further includes a frequency initializing device connected to receive a reference clock signal and in communication with the voltage controlled oscillator employed to assist acquisition of lock of the voltage controlled oscillator to the reference clock signal during initialization. A loop selection device is in communication with the frequency initializing device to receive a frequency increase signal and decrease signal indicating whether the oscillator clocking signal is greater than or lesser than the reference clock signal. The frequency initializing device is further connected to receive a synchronization lost signal. The frequency initializing device is in communication with the low pass filter to switch control of the voltage controlled oscillator from the frequency initializing device after initialization to the phase detector for recovery of the serialized digital data and the synchronizing clock.

The clock and data recovery circuit further includes a recovered data selector in communication with the data capture device to receive the plurality of acquired multiple phased data signals and in communication with the multiple phase generator to receive the plurality of multiple phased clocking signals, the recovered data selector selecting which of the plurality of acquired multiple phased data signals are to be transferred to external circuitry for further processing. The recovered data selector has at least one mode terminal receiving a selection source indication signal for selecting a mode by which of plurality of acquired multiple phased data signals are selected for to external circuitry for further processing. If the selection source indication signal indicates that the mode is to be a manual mode, a jitter factor of the recovered data is examined and a grouping of the plurality of acquired multiple phased data signals is selected based on the jitter factor.

The clock and data recovery circuit has a bit error estimator and synchronization detector in communication with the recovered data selector to receive the selected plurality of acquired multiple phased data signals, evaluate the selected plurality of acquired multiple phased data signals for a bit error rate, and from the bit error rate, transfer a bit error threshold signal to the recovered data selector to indicate whether the bit error rate is greater or lesser than a desired bit error rate. If the selection source indication signal indicates that the mode is to be a bit error control wherein the bit error threshold signal determines which of the plurality of acquired multiple phased data signals are to be transferred for further processing.

The bit error estimator and synchronization detector determines whether the plurality of acquired multiple phased data signals are in synchronization with the reference clock and is not in synchronization providing the synchronization lost signal to the loop selection device, such that the loop selection device switches the low pass filter to receive the reference signal.

DETAILED DESCRIPTION OF THE INVENTION

In communications systems such as the Transition Minimized Differential Signaling (TMDS) data and clock channels of the HDMI™, there is a need for clock and data recovery circuits that provide simplicity, low power consumption and small area, while having the ability to operate over a broad range of frequencies. The HDMI™ has a transmission data rate that varies from 250 Mbps to 1.65 Gbps. The communication system of this invention includes a clock and data recovery system that has a single voltage controlled oscillator (VCO) to synchronize the TMDS data using a binary (bang-bang) phase detector. The VCO is a ring oscillator having serially connected cross coupled differential amplifiers. Each of the amplifiers has their output cross connected to the inputs of the following differential amplifier. The last differential amplifier is in turned connected to the inputs of the first differential amplifier. The differential amplifiers each have a biasing connection to adjust the delay of each differential amplifier and thus the frequency of oscillation of the VCO.

An advantage of the multiple differential amplifiers of the VCO is that equally spaced multiphase clocks are generated. The VCO is so controlled that its output multiphase clocks synchronize with input data. A frequency acquisition aid is employed to help acquire lock to an input reference clock at startup. The VCO actually oscillates at 2.5 times input reference clock frequency. Once the VCO frequency is close enough to the desired clock frequency, the VCO is switched to data tracking loop in which the clock phase is adjusted by charging/discharging VCO control voltage according to the phase error between the clocks and input data transitions. A bangbang phase detector with dynamic gain-control is introduced to ensure minimum VCO frequency drift in the absence of data transition for TMDS data covering wide variation of data rate. Three time over-sampling provides automatic retiming and bit selection flexibility for better jitter tolerance particularly to asymmetric jitter. An auto-scale frequency detector is incorporated to realize smooth transition from the input reference clock frequency and the timing of the input data transitions.

The VCO of the clock and data recovery circuit of the invention has an advantage over a delay line of the prior art in that the VCO is controlled to track the data by a simple charge pump circuitry. There is no complicated delay line control circuit which permits much less complexity, resulting in less area and power consumption. There is no phase quantization error since the clock tracks the data constantly. Simple bit selection logic for the data recovery can be easily implemented using 3× over-sampled bits for better jitter tolerance particularly tolerance to asymmetric jitter.

Figure 3:
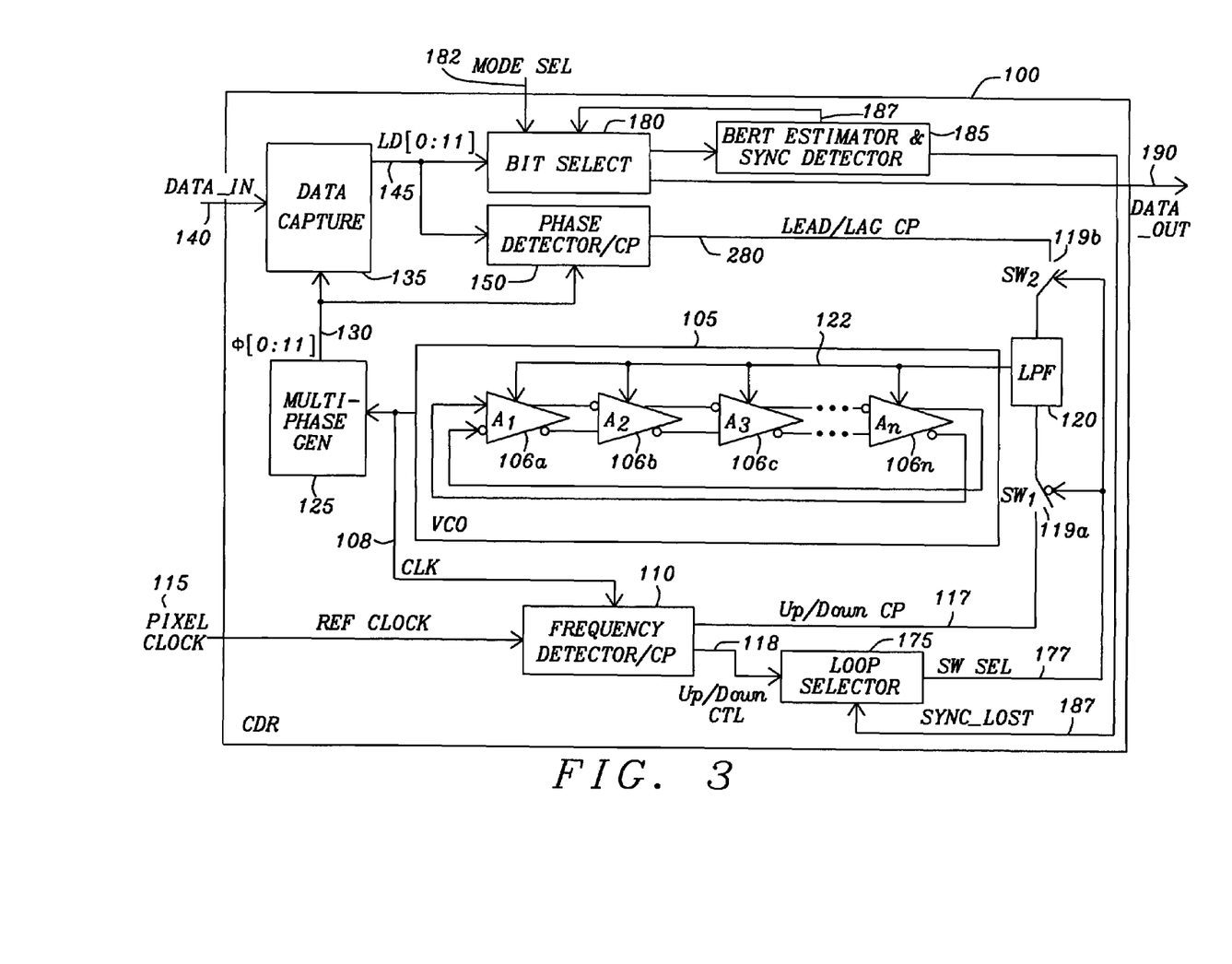
FIG. 3 is block diagram of the clock data recovery and synchronization circuit of this invention.

Refer now to FIG. 3 for a more detailed description of the clock and data recovery circuit of this invention. The clock and data recovery circuit 100 has a voltage controlled oscillator 105 that is composed of a serially connected ring of differential amplifiers 106a, ..., 106n. Each of the differential amplifiers 106a, 106n have their outputs connected to the input of the succeeding differential amplifiers 106a, ..., 106n with the outputs of the last amplifier 106n connected to the inputs of the first amplifier 106a. One of the outputs of one of the differential amplifiers 106a, ..., 106n (i.e. the last amplifier 106n) is applied to a buffer (not shown) and becomes the clocking signal 108.

The clocking signal 108 is applied to the frequency detector/charge pump 110. The pixel clock 115 of the HDMI™ is used as a reference clock and applied as a second input to the frequency detector/charge pump 110. The pixel clock 115 is compared to the clocking signal 108 to generate up/down error signals 117 and 118. The up/down error signal 117 is applied through the switch SW, 119a to the low pass filter 120. The low pass filter 120 filters the up/down error signal 117 to remove any high frequency content to create the oscillator correction voltage 122. The oscillator correction voltage 122 is the signal that adjusts the delay of each of the differential amplifiers 106a, ..., 106n to adjust the frequency of the clocking signal 108. The frequency detector/charge pump 110 provides the initialization frequency of the VCO 105. The VCO 105 actually oscillates at 2.5 times input clock frequency pixel clock 115 for the HDMI™ application.

Figure 4:
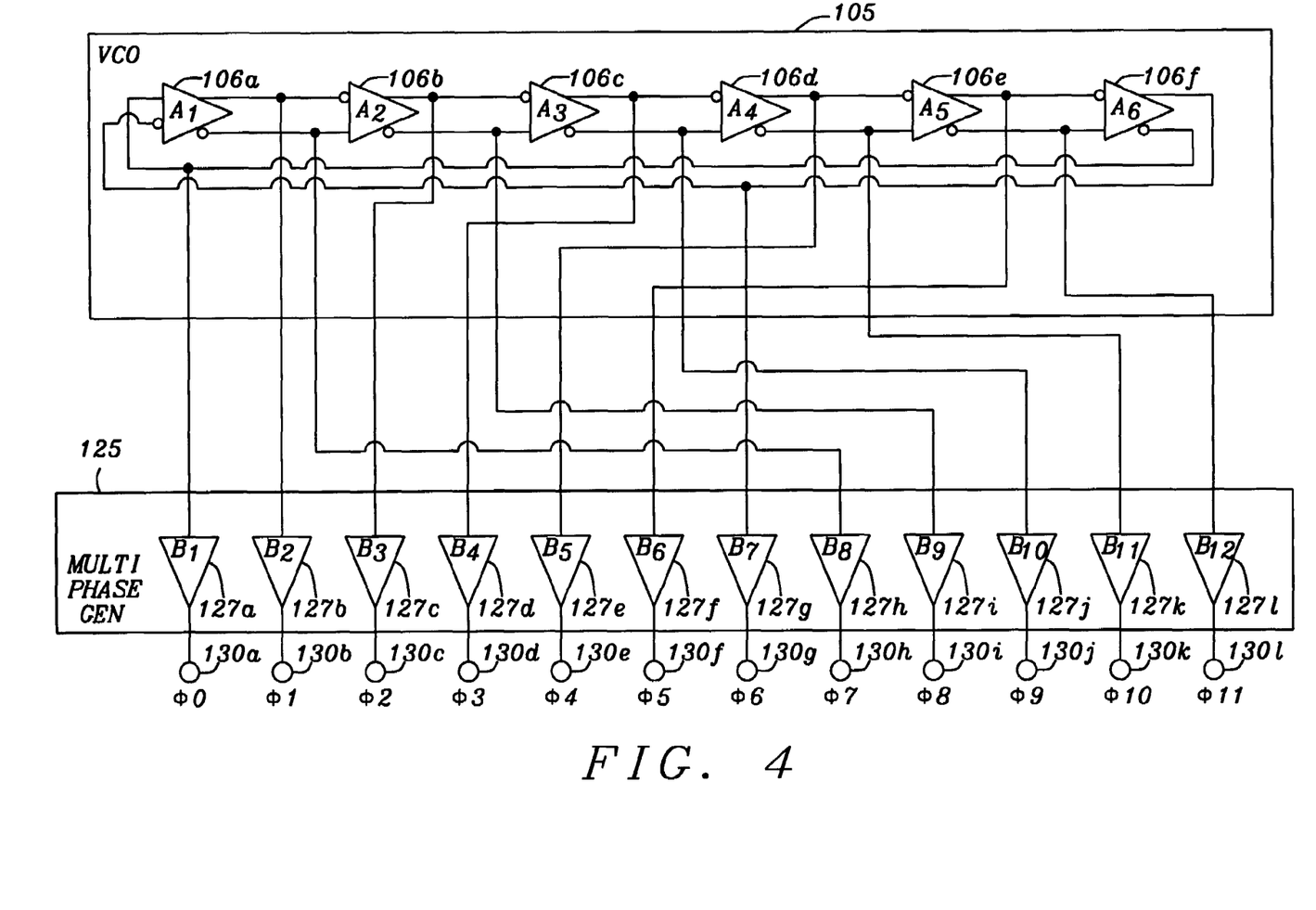
FIG. 4 is a schematic diagram of the voltage controlled oscillator and multiple phase generator of the clock data recovery and synchronization circuit of this invention.

The clocking signal 108 is also applied to the multiple phase generator 125 which develops the multiple phase clocks φ[0:11] 130. Referring to FIG. 4, the outputs of the differential amplifiers 106a, ..., 106f of the voltage controlled oscillator in fact provides each phase of the multiple phase clocks as inputs to the multiple phase clock generator 125. The multiple phase clock generator 125 is formed of the buffer circuits 127a, ..., 127l. The inputs of the each buffer are connected to the appropriately phased output of the differential amplifiers 106a, ..., 106f. The outputs of the buffer circuits 127a, ..., 127l provide the multiple phase clocks φ130a, ..., φ11 130l. In the illustration of FIG. 4, as shown, the ring oscillator of the VCO 105 contains six differential amplifiers 106a, ..., 106f serially connected output to subsequent input. With the outputs of the last differential amplifier 106f crossed connected to the inputs of the first differential amplifier 106a. The out of phase output of the last differential amplifier 106f is connected to the first buffer circuit 127a to develop the first phase clock signal φ0 130a and the subsequent in phase outputs of the differential amplifiers 106a, ..., 106e are connected to the buffer circuits 127b, ..., 127f and develop the phased clock signals φ1 130b, ..., φ5 130f. The in phase output of the last differential amplifier 106f is connected to the seventh buffer circuit 127g to develop the seventh phase clock signal φ6 130g and the subsequent out of phase outputs of the differential amplifiers 106a, ..., 106e are connected to the buffer circuits 127h, ..., 127l and develop the phased clock signals φ7 130h, ..., φ11 130l.

Figure 5:
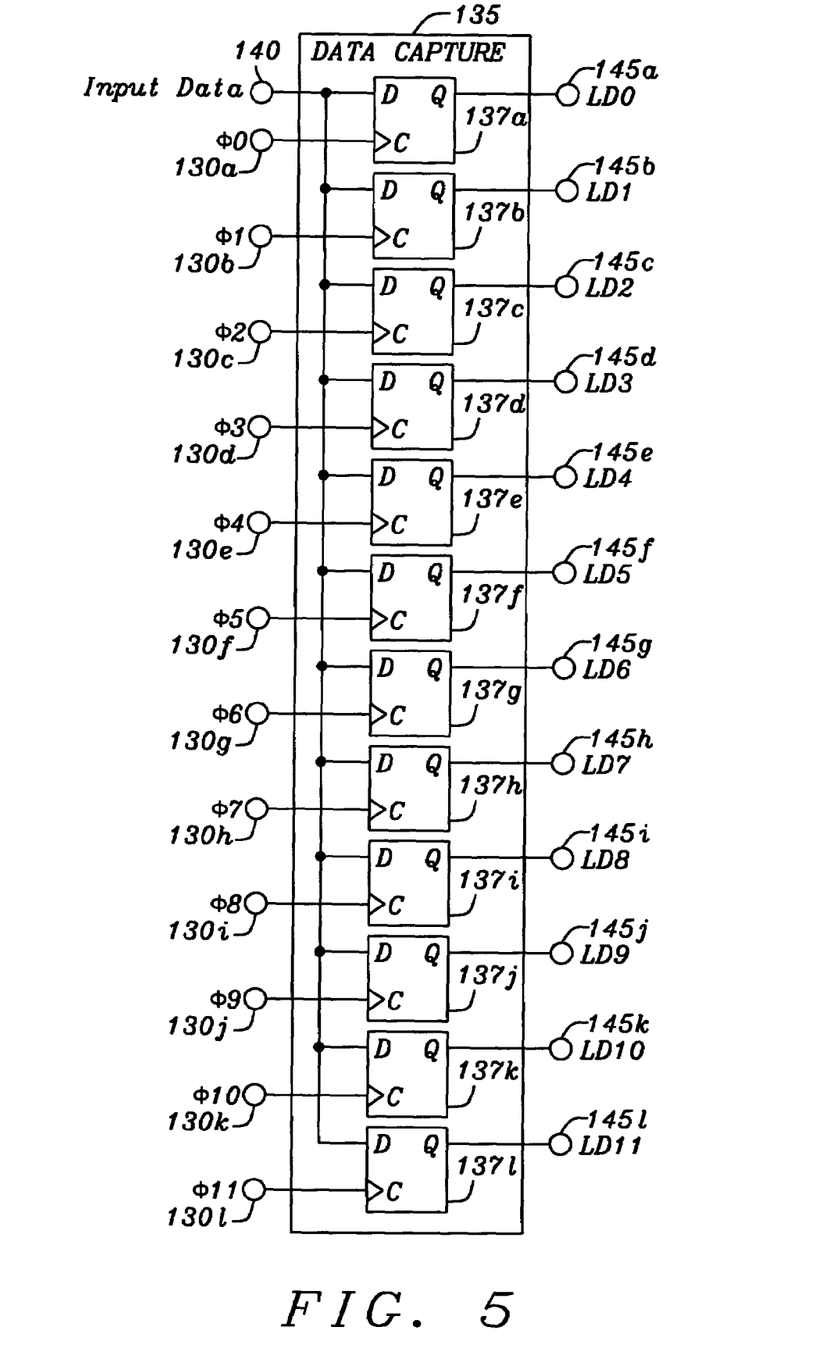
FIG. 5 is schematic diagram of the data capture circuit of the clock data recovery and synchronization circuit of this invention.

Returning to FIG. 3, the multiple phase clocks φ[0:11] 130 are inputs to the data capture device 135. The data input 140 is the ten bit serialized encoded data from one of the data channels 15a, 15b, and 15c TMDS link of FIG. 2. U.S. Pat. No. 6,762,560 (Guosheng), incorporated herein by reference, illustrates the structure of the data capture device 135 in more detail. A simplified schematic of the data capture device 135 is shown in FIG. 5. The data capture device includes of the latcher circuits 137a, ..., 137l that are similar to those shown in Guosheng et al. The input data 140 is applied to the data input terminals of each of the latcher circuits 137a, ..., 137l. The multiple phase clocks φ130a, ..., φ11 130l are applied to the each of the respective clock terminals of the latcher circuits 137a, ..., 137l. The latched data LD0 145a, ..., LD11 145l is presented respectively at the output terminals of each of the latcher circuits 137a, ..., 137l.

Figure 6:
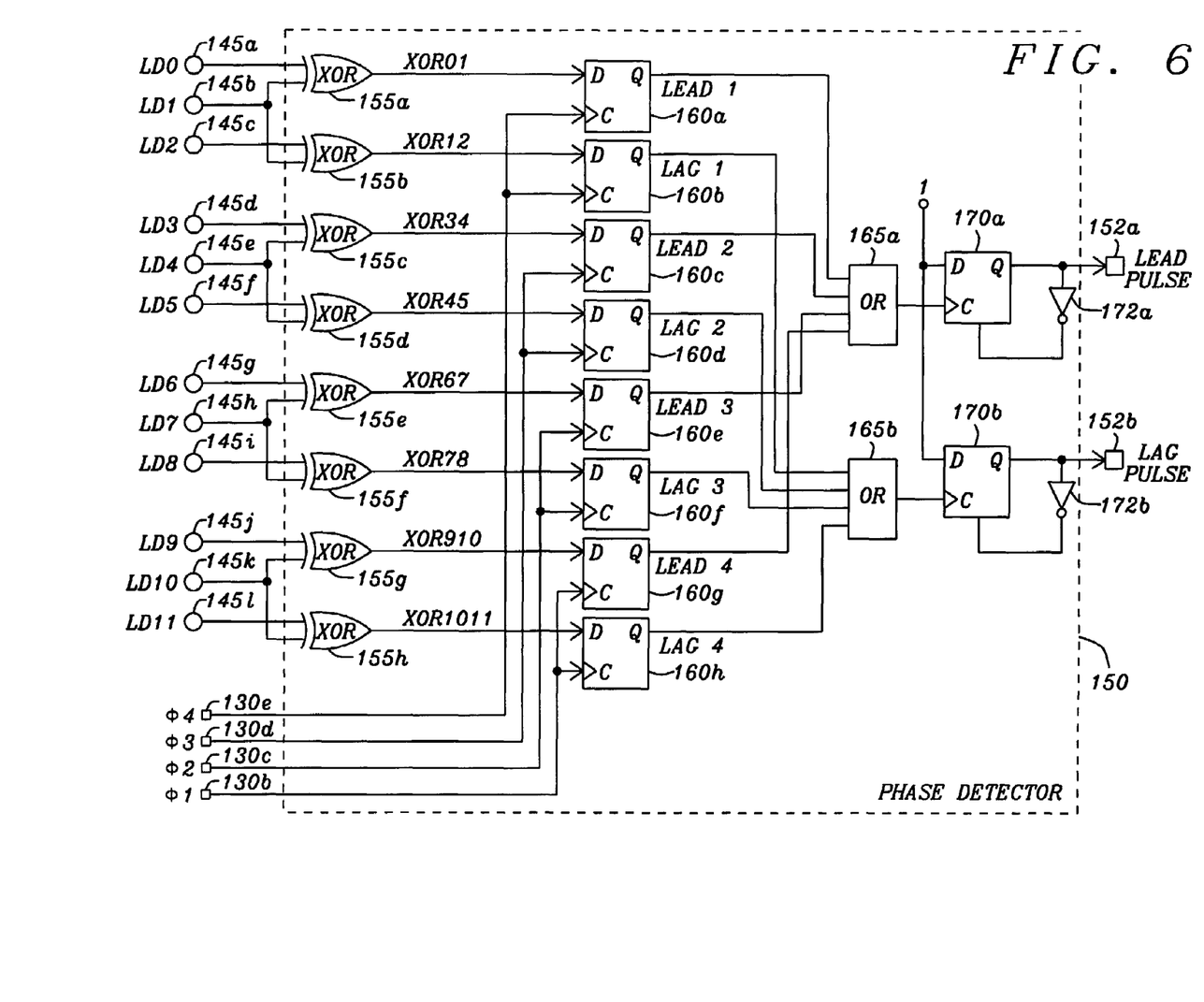
FIG. 6 is a schematic diagram of the phase detector of the clock data recovery and synchronization circuit of this invention.

Returning to FIG. 3, the latched data LD[0:11] 145 from the data capture device 135 is transferred to the phase detector/charge pump 150. Referring to FIG. 6 for a discussion of the bang-bang phase detector portion of the phase detector/charge pump 150. The latched data LD0 145a, ..., LD11 145l are input to the exclusive-OR circuits 155a, ..., 155h. The latched data LD0 145a, ..., LD11 145l are compared pair wise with the adjacent latched data and the differences in the periods when the latched data LD0 145a, ..., LD11 145l are differing causes the exclusive-OR circuits 155a, ..., 155h to be activated. The latched data LD0 145a and LD2 145c are compared with the latched data LD1 145b. The latched data LD3 145d and LD5 145f are compared with the latched data LD4 145e. The latched data LD6 145g and LD8 145i are compared with the latched data LD7 145h. The latched data LD9 145j and LD11 145l are compared with the latched data LD10 145k. The transitions that occur between the latched data LD0 145a, ..., LD11 145l appear at the outputs of the exclusive-OR circuits 155a, ..., 155g. The outputs of the exclusive-OR circuits 155a, ..., 155h are the data inputs of the data latches 160a, ..., 160h. These differences between the pair wise latched data LD0 145a, ..., LD11 145l are latched by the phase clocks φ1 130b, φ4 130e, φ7 130h, and φ10 130k.

The phase clocks φ4 130e captures the difference between the latched data LD0 145a and the latched data LD1 145b in the data latch 160a and the latched data LD2 145c and the latched data LD1 145b in the data latch 160b. The phase clocks φ7 130h captures the difference between the latched data LD3 145d and the latched data LD4 145e in the data latch 160c and the latched data LD5 145f and the latched data LD4

145e in the data latch 160d. The phase clocks φ10 130k captures the difference between the latched data LD6 145g and the latched data LD7 145h in the data latch 160e and the latched data LD8 145i and the latched data LD7 145h in the data latch 160f. The phase clocks φ1 130b captures the difference between the latched data LD9 145j and the latched data LD10 145k in the data latch 160g and the latched data LD11 145l and the latched data LD10 145k in the data latch 160h. The outputs of the data latches 160a, 160c, 160e, and 160g provide the indication that the phasing of the voltage controlled oscillator leads the data input 140. Conversely, the outputs of the data latches 160b, 160d, 160f, and 160h provide the indication that the phasing of the voltage controlled oscillator lags the data input 140.

The bang-bang phase detector 150 suffers a critical drawback for TMDS encoded data in which transitions are minimized and data rate is variable. The loop gain of the bang-bang phase detector is transition dependant, which leads to dramatic variation in loop gain and results in large jitter inherent in the VCO 105. The phase detector 150 uses twelve bits of the sampled input data 140 and twelve equally spaced phased clock signals φ0 130a, . . . , φ11 130l to ensure the capture of every transition. A simple circuit using two data latches 170a and 170b after the OR gates 165a and 165b is introduced to dynamically suppress gain at high transitions and reduce VCO jitter as a result for wide range of data rate variation. The lead signals from the data latches 160a, 160c, 160e, and 160g are the inputs to the OR gate 165a. The OR'ed lead signals are the clock inputs to the latch 170a. The data input of the data latches 170a is connected to a logical one (1) such that a transition of the lead signal causes the lead pulse 152a to be activated. The lead pulse 152a is the input to the inverter 172a. The output of the inverter 172a is the input to the reset of the data latch 170a to immediately reset the data latch 170a. The lag signals from the data latches 160b, 160d, 160f, and 160h are the inputs to the OR gate 165b. The OR'ed lead signals are the clock inputs to the latch 170b. The data input of the data latch 170b is connected to a logical one (1) such that a transition of the lead signal causes the lag pulse 152b to be activated. The lag pulse 152b is the input to the inverter 172b. The output of the inverter 172b is the input to the reset of the data latch 170a to immediately reset the data latch 170a.

Figure 7A:
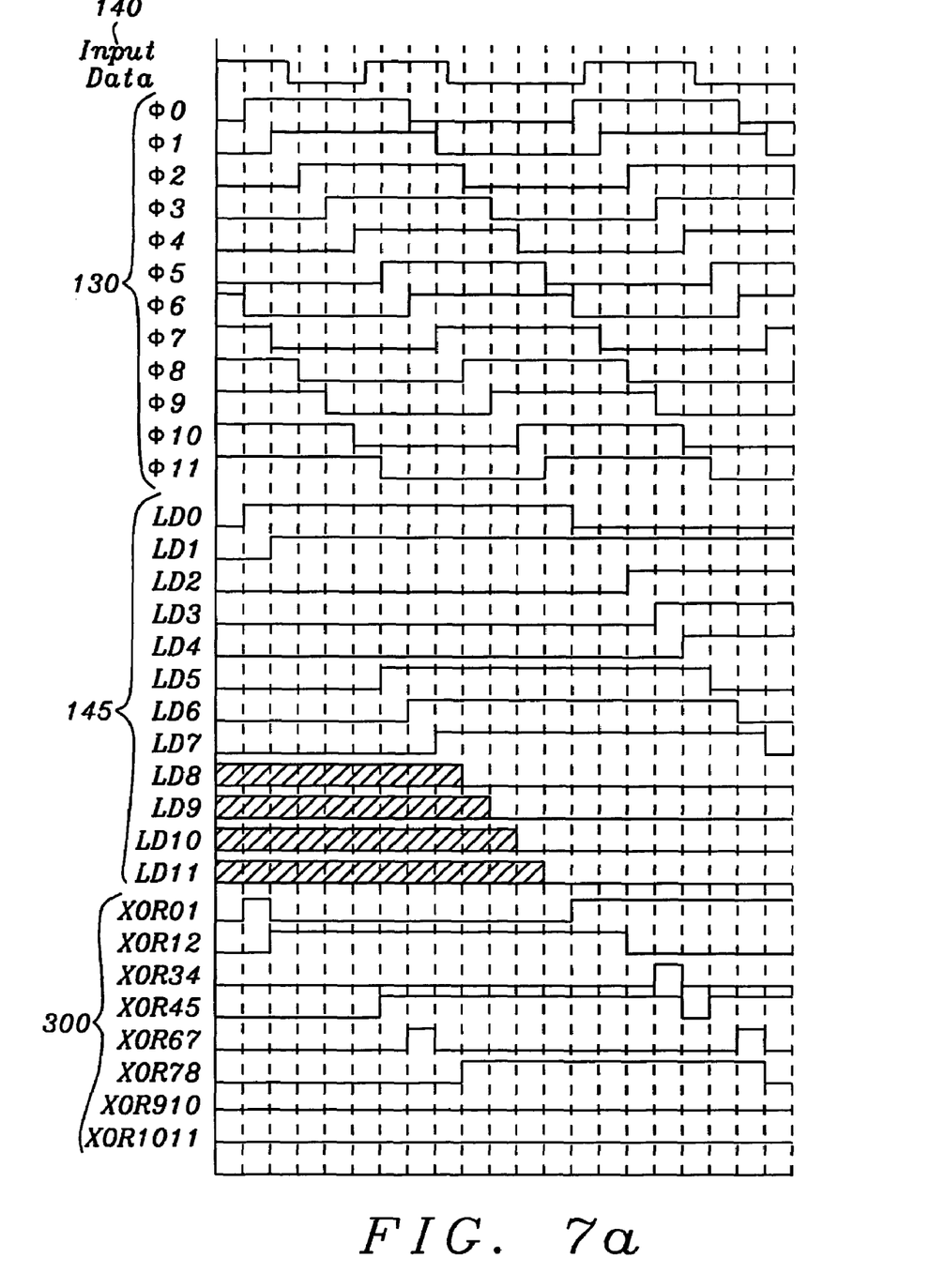
FIGS. 7a and 7b are timing diagrams illustrating the operation of the data capture and phase detector of the clock data recovery and synchronization circuit of this invention.
Figure 7B:
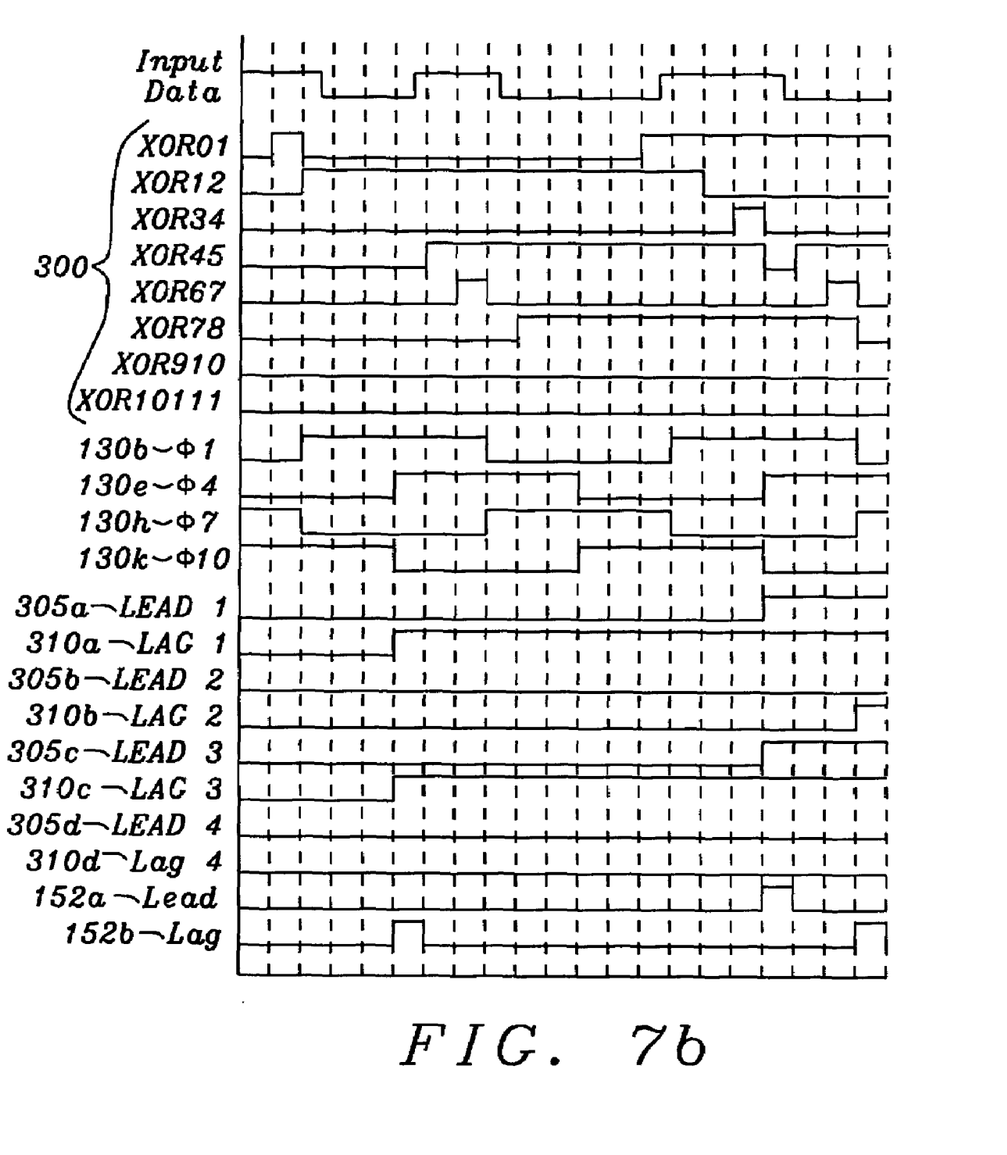

Referring to FIGS. 7a and 7b, the multiple phase clocks [φ0:φ11] 130 latch the serialized input data 140 to generate the latched data [LD0:LD11] 145. The outputs 300 of the exclusive-OR circuits 155a, . . . , 155h determine the relative positions of the data and clock phases. The relative positions are captured by the phase clocks φ1 130b, φ4 130e, φ7 130h, and φ10 130k in the latches data latches 160a, . . . , 160h to generate the Lead signals 305a, . . . , 305d and the Lag signals 310a, . . . , 310d, which are OR'ed and Latched to generate the Lead Pulse 152a and the Lag Pulse 152b.

Figure 8:
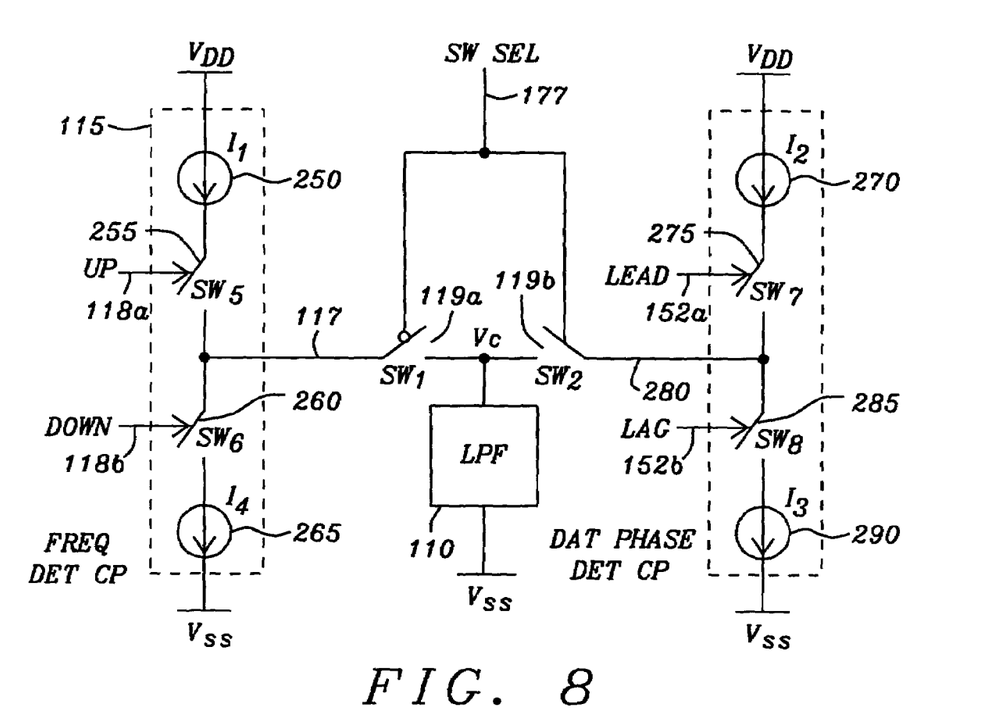
FIG. 8 is a schematic diagram of the operation of the charge pumping for providing the control voltage of the voltage controlled oscillator of the clock data recovery and synchronization circuit of this invention.

The lead pulse 152a and lag pulse 152b are the inputs to the charge pump that provides the oscillator correction voltage 122 for adjusting the voltage controlled oscillator 105. Referring to FIG. 8, two charge pumps are implemented with their outputs connected through the switches SW1 119a and SW2 119b to the input control terminal Vc of the low pass filter 110. The first charge pump is incorporated in the frequency detector/charge pump 110 and is controlled by the up/down signals 255a and 255b and the second charge pump is incorporated in the phase detector/charge pump 150 and is controlled by the data phase detector of FIG. 6.

Upon initialization of the clock and data recovery circuit of this invention, the charge pump incorporated in the phase detector/charge pump 150 is set to a high impedance state with the switch SW2 119b being open. The VCO 105 is thus controlled by charge pump incorporated in the frequency detector/charge pump 110 only. Alternately, When the VCO is approximately at the frequency of the data the switch SW1 119a is opened to set the charge pump incorporated in the frequency detector/charge pump 110 to a high impedance state and the switch SW2 119b is closed such that the VCO 105 is controlled by the data frequency detector/charge pump 110. The charge pump incorporated in the frequency detector/charge pump 110. The frequency detector 110 generates the up/down signals 255a and 255b that indicate whether the frequency of oscillation of the VCO 105 is less or greater than the reference pixel clock 115. The up/down signals 255a and 255b respectively open and close the switches $SW_5$ 255 and $SW_6$ 260 to connect and disconnect the current sources 250 and 265 to the low pass filter 110 to provide the oscillator correction voltage 122 to the voltage controlled oscillator 105.

When the frequency is approximately equal to the frequency of the pixel reference signal 115, the switch SW1 119a is opened and the switch SW2 119b is closed. The lead pulse 152a and lag pulse 152b respectively open and close the switches $SW_7$ 275 and $SW_8$ 285 to connect and disconnect the current sources 270 and 290 to the low pass filter 110 to provide the oscillator correction voltage 122 to the voltage controlled oscillator 105.

Figure 9:
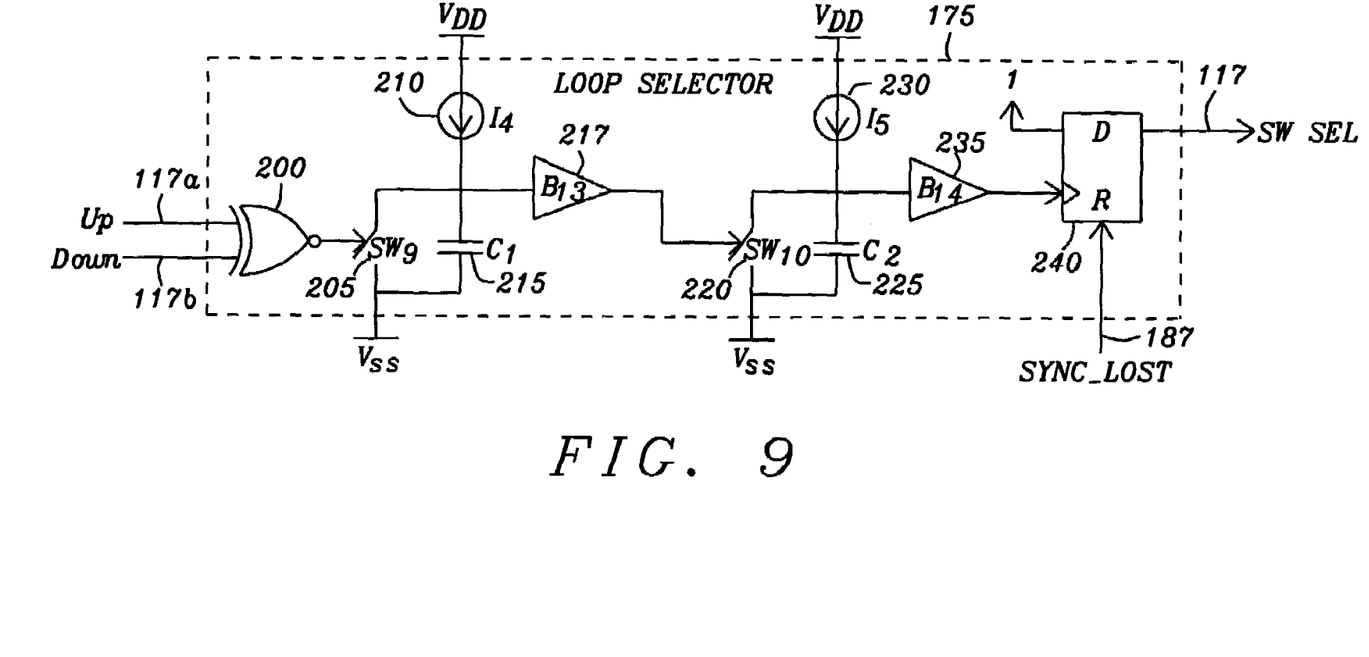
FIG. 9 is schematic diagram of the loop selection circuit of the clock data recovery and synchronization circuit of this invention.

The loop selector 175, as shown in FIG. 9, receives the up/down signals 117a and 117b from the frequency detector/charge pump 110, which are applied to the inputs of the exclusive-NOR 200. The output of the exclusive-NOR 200 is the control signal for the switch $SW_9$ 205. The switch $SW_9$ 205 is opened and closed to control the charging of the capacitor $C_1$ 215 by the current source 210. When the frequency of the VCO 105 is not equal to that of the pixel reference clock 115, the up/down signals 255a and 255b are different and the switch $SW_9$ 205 is deactivated and the capacitor $C_1$ 215 is charged. When the voltage present on the capacitor $C_1$ 215 is greater than the threshold of the buffer 217, switch $SW_{10}$ 220 activated discharging the capacitor $C_2$ 225 setting the clock input to the flip-flop 240 to a zero level. When the synchronization lost signal 187 is active, the flip-flop 240 is reset and the switch select signal 117 is set to activate the switch SW1 119a and deactivate the switch SW2 119b such that the voltage controlled oscillator is controlled by the frequency detector/charge pump 110.

When the up/down signals 255a and 255b from the frequency detector/charge pump 110 indicate that the frequency of the clocking signal 108 of the VCO 105 is nearly equal to the pixel reference clock 115, the difference of up/down signals 255a and 255b become very small and the switch $SW_9$ 205 is closed more often and the capacitor $C_1$ 215 is not charge sufficiently to reach the threshold of the buffer 217. The switch $SW_{10}$ 220 becomes open and the capacitor $C_2$ 225 is charged to a voltage greater than the threshold of the buffer 235 and the logical 1 is clocked through the flip-flop 240. The switch select signal now deactivates the switch SW1 119a and activates the switch SW2 119b so that the oscillator correction voltage 122 is then controlled by the phase detector/charge pump 150.

Returning to FIG. 3, once the VCO 105 has achieved synchronization, the latched data LD[0:11] 145 is transferred to the bit selection circuit 180. The bit selection circuit 182 has two modes of operation that are set by the mode select signal 182. The modes are a manual operation where an external circuit evaluates the jitter characteristic of the operating clock and data recovery circuit, and an auto-optimized selection mode for optimum bit error rate. The desired sampling location is selected automatically to cope with asymmetric jitter based on feedback from a bit error rate estimator and synchronization detection circuit 185. The bit error rate estimator and synchronization detection circuit 185 receives a selected set of the latched data LD[0:11] 145 evaluates the bit error and feed back a bit error control signal 187 to the bit selection circuit 180.

Figure 10:
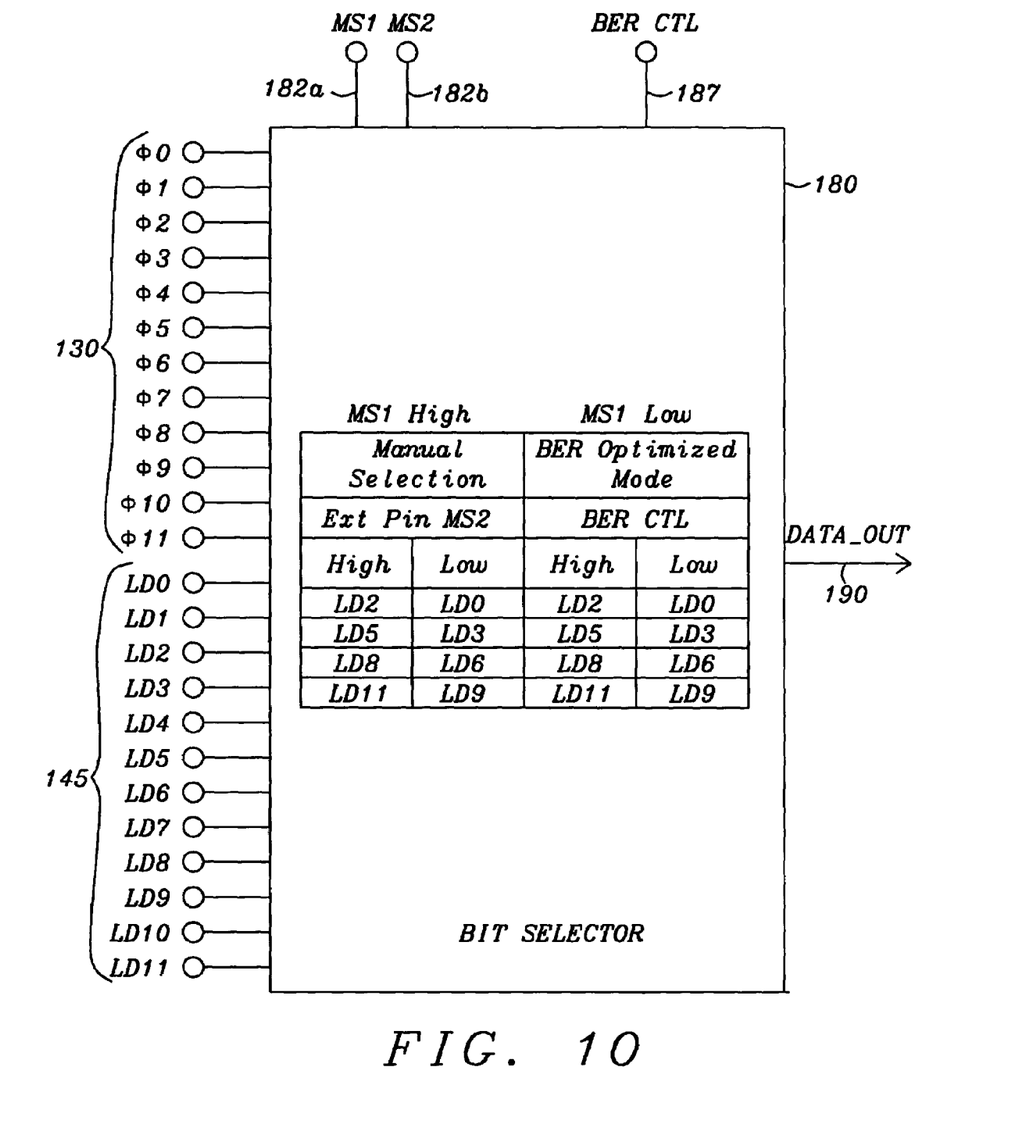
FIG. 10 is a block diagram of the bit selector of the clock data recovery and synchronization circuit of this invention.

Referring to FIG. 10, the bit selection circuit 180 receives the phased clock signals [φ10:φ11] 130 and the latched data LD[0:11] 145. The mode selection signals MS1 182*a* and MS2 182*b* determine the method of selection of the latched data LD[0:11] 145 for transmission to the data output 190 for transfer to external circuitry for further processing. In the preferred embodiment of clock and data recovery for an HDMI™, the data is deserialized into four separate output signals for decoding and recovery of the pixel and audio data. The pixel and audio data is aligned with one of the twelve phased clock signals [φ0:φ11] 130 The selected clock is chosen and transferred with the recovered data.

If the mode selection signals MS1 182*a* and MS2 182*b* indicate that the manual selection is to be used (MS1=High), the external evaluation of the jitter determines the data selection by toggling the mode selection signal MS2 182*b*. If the mode selection signal MS2 182*b* is set to a logical 1 (high), the latched data LD2 145*c*, LD5 145*f*, LD8 145*i*, LD11 145*l* are transferred to the data output terminals 190. Alternately, if the mode selection signal MS2 182*b* is set to a logical 0 (low), the latched data LD0 145*a*, LD3 145*d*, LD6 145*g*, LD9 145*j* are transferred to the data output terminals 190.

If the mode selection signals MS1 182*a* and MS2 182*b* indicate that the bit error rate optimization mode is to be used (MS1=Low), the bit error control signal 187 provides the selection of the latched data LD[0:11] 145. If the bit error control signal 187 is set to a logical 1 (High), latched data LD2 145*c*, LD5 145*f*, LD8 145*i*, LD11 145*l* are transferred to the data output terminals 190. If the bit error control signal 187 is set to a logical 0 (Low), the latched data LD0 145*a*, LD3 145*d*, LD6 145*g*, LD9 145*j* are transferred to the data output terminals 190.

In summary, the apparatus of this invention performs a process for recovery of a synchronizing clock and serialized digital data from a received communication signal. The process begins by receiving the communication signal and the synchronizing clock that acts as a reference clocking signal. An oscillator is initialized to the reference clocking signal to assist acquisition of lock of the oscillator clocking signal to the reference clock signal during initialization. The serialized digital data is recovered from the communication signal. The oscillator clocking signal is converted to a plurality of multiple phased clocking signals, each signal being phase shifted from the oscillator clocking signal. The plurality of multiple phased clocking signals is then used to generate the recovered data. Upon initializing the oscillator clocking signal, the oscillator clocking signal is then synchronized to the received communication signal. The oscillator clocking signal is determined if it is in phase with the recovered serialized data and providing a lead signal and a lag signal indicating whether the oscillator clocking signal is in phase with the recovered serialized data. The lead and lag signals are then low pass filtered to develop a frequency adjusting voltage for the voltage controlled oscillator. Those of the plurality of acquired multiple phased data signals that are synchronized to the plurality of multiple phased clocking signals are selected to be transferred to external circuitry for further processing.

The selecting which of the plurality of acquired multiple phased data signals are synchronized is controlled by a selection source indication signal. The source indication signals selects a mode by which of plurality of acquired multiple phased data signals are selected for to external circuitry for further processing. If the selection source indication signal indicates that the mode is to be a manual mode, a jitter factor of the recovered data is examined and a first grouping of the plurality of acquired multiple phased data signals is selected based on the jitter factor. If the selection source indication signal indicates that the mode is to be a bit error control, a second grouping of the plurality of acquired multiple phased data signals is selected as a function of a bit error rate for further processing. The a bit error rate of the selected plurality of acquired multiple phased data signals is estimated and indicated from the bit error rate transfer signal, whether the bit error rate is greater or lesser than a desired bit error rate.

The plurality of acquired multiple phased data signals are examined to be in synchronization with the reference clock and if not in synchronization connecting the low pass filter to receive the reference clocking signal.

While this invention has been particularly shown and described with reference to the preferred embodiments thereof, it will be understood by those skilled in the art that various changes in form and details may be made without departing from the spirit and scope of the invention.

The invention claimed is:

1. A clock and data recovery circuit for recovery of a synchronizing clock and serialized digital data from a received communication signal comprising:
   a data capture device which receives said communication signal and recovers said serialized digital data;
   a voltage controlled oscillator in communication with said data capture device to provide an oscillator clocking signal synchronized to said received communication signal;
   a multiple phase generator in communication with said voltage controlled oscillator to receive and convert said oscillator clocking signal to a plurality of multiple phased clocking signals, each signal being phase shifted from said oscillator clocking signal;
   a phase detector in communication with the data capture device to receive said recovered serialized data and in communication with said multiple phase generator to acquire said plurality of multiple phased clocking signals, said phase detector determining if said oscillator clocking signal is in phase with said recovered serialized data and providing a lead signal and a lag signal indicating whether said oscillator clocking signal is in phase with said recovered serialized data;
   a low pass filter in communication with said phase detector to receive and low pass filter said lead signal and said lag signal to develop a frequency adjusting voltage for said voltage controlled oscillator; and
   a frequency initializing device connected to receive a reference clock signal and in communication with said voltage controlled oscillator employed to assist acquisition of lock of said voltage controlled oscillator to said reference clock signal during initialization; and
   a loop selection device in communication with said frequency initializing device to receive a frequency increase signal and decrease signal indicating whether a frequency of said oscillator clocking signal is greater than or lesser than a frequency of said reference clock signal, connected to receive a synchronization lost signal, and in communication with said low pass filter to switch control of said voltage controlled oscillator from said frequency initializing device after initialization of said voltage controlled oscillator to said phase detector for recovery of said serialized digital data and said synchronizing clock; wherein said data capture device is in communication with said multiple phase generator to receive said plurality of multiple phased clocking signals, said data capture device acquiring said serialized digital data with each of said plurality of multiple phased clocking signals to create a plurality of acquired multiple phased data signals.

2. The clock and data recovery circuit of claim 1 further comprising:
a recovered data selector in communication with said data capture device to receive said plurality of acquired multiple phased data signals and in communication with said multiple phase generator to receive said plurality of multiple phased clocking signals, said recovered data selector selecting which of said plurality of acquired multiple phased data signals are to be transferred to external circuitry for further processing.

3. The clock and data recovery circuit of claim 2 wherein the recovered data selector further comprises:
at least one mode terminal receiving a selection source indication signal for selecting a mode by which of plurality of acquired multiple phased data signals are selected for to external circuitry for further processing.

4. The clock and data recovery circuit of claim 3 wherein if said selection source indication signal indicates that said mode is to be a manual mode, a jitter factor of said recovered data is examined and a grouping of said plurality of acquired multiple phased data signals is selected based on said jitter factor.

5. The clock and data recovery circuit of claim 3 further comprising:
a bit error estimator and synchronization detector in communication with said recovered data selector to receive said selected plurality of acquired multiple phased data signals, evaluate said selected plurality of acquired multiple phased data signals for a bit error rate, and from said bit error rate transfer a bit error threshold signal to said recovered data selector to indicate whether said bit error rate is greater or lesser than a desired bit error rate.

6. The clock and data recovery circuit of claim 5 wherein if said selection source indication signal indicates that said mode is to be a bit error control wherein said bit error threshold signal determines which of said plurality of acquired multiple phased data signals are to be transferred for further processing.

7. The clock and data recovery circuit of claim 5 wherein said bit error estimator and synchronization detector determines whether said plurality of acquired multiple phased data signals are in synchronization with said reference clock and is not in synchronization providing said synchronization lost signal to said loop selection device, such that said loop selection device switches said low pass filter to receive said reference signal.

8. A communication system for the transmission and reception of a synchronizing clock and serialized digital data over a communication medium comprising:
a receiver comprising:
a clock and data recovery circuit for recovery of the synchronizing clock and serialized digital data from a received communication signal comprising:
a data capture device which receives said communication signal and recovers said serialized digital data;
a voltage controlled oscillator in communication with said data capture device to provide an oscillator clocking signal synchronized to said received communication signal;
a multiple phase generator in communication with said voltage controlled oscillator to receive and convert said oscillator clocking signal to a plurality of multiple phased clocking signals, each signal being phase shifted from said oscillator clocking signal;
a phase detector in communication with the data capture device to receive said recovered serialized data and in communication with said multiple phase generator to acquire said plurality of multiple phased clocking signals, said phase detector determining if said oscillator clocking signal is in phase with said recovered serialized data and providing a lead signal and a lag signal indicating whether said oscillator clocking signal is in phase with said recovered serialized data;
a low pass filter in communication with said phase detector/charge pump to receive and low pass filter said lead signal and said lag signal to develop a frequency adjusting voltage for said voltage controlled oscillator
a frequency initializing device connected to receive a reference clock signal and in communication with said voltage controlled oscillator employed to assist acquisition of lock of said voltage controlled oscillator to said reference clock signal during initialization; and
a loop selection device in communication with said frequency initializing device to receive a frequency increase signal and decrease signal indicating whether a frequency of said oscillator clocking signal is greater than or lesser than a frequency of said reference clock signal, connected to receive a synchronization lost signal, and in communication with said low pass filter to switch control of said voltage controlled oscillator from said frequency initializing device after initialization of said voltage controlled oscillator to said phase detector for recovery of said serialized digital data and said synchronizing clock; wherein said data capture device is in communication with said multiple phase generator to receive said plurality of multiple phased clocking signals, said data capture device acquiring said serialized digital data with each of said plurality of multiple phased clocking signals to create a plurality of acquired multiple phased data signals.

9. The communication system of claim 8 wherein the clock and data recovery circuit further comprises:
a recovered data selector in communication with said data capture device to receive said plurality of acquired multiple phased data signals and in communication with said multiple phase generator to receive said plurality of multiple phased clocking signals, said recovered data selector selecting which of said plurality of acquired multiple phased data signals are to be transferred to external circuitry for further processing.

10. The communication system of claim 9 wherein the recovered data selector further comprises:
at least one mode terminal receiving a selection source indication signal for selecting a mode by which of plurality of acquired multiple phased data signals are selected for to external circuitry for further processing.

11. The communication system of claim 10 wherein if said selection source indication signal indicates that said mode is to be a manual mode, a jitter factor of said recovered data is examined and a grouping of said plurality of acquired multiple phased data signals is selected based on said jitter factor.

12. The communication system of claim 10 wherein the clock and data recovery circuit further comprises:
   a bit error estimator and synchronization detector in communication with said recovered data selector to receive said selected plurality of acquired multiple phased data signals, evaluate said selected plurality of acquired multiple phased data signals for a bit error rate, and from said bit error rate transfer a bit error threshold signal to said recovered data selector to indicate whether said bit error rate is greater or lesser than a desired bit error rate.

13. The communication system of claim 12 wherein if said selection source indication signal indicates that said mode is to be a bit error control wherein said bit error threshold signal determines which of said plurality of acquired multiple phased data signals are to be transferred for further processing.

14. The communication system of claim 12 wherein said bit error estimator and synchronization detector determines whether said plurality of acquired multiple phased data signals are in synchronization with said reference clock and is not in synchronization providing said synchronization lost signal to said loop selection device, such that said loop selection device switches said low pass filter to receive said reference signal.

15. The communication system of claim 8 wherein said communication system is selected from a group of communication systems consisting of high definition multimedia interface communication systems and digital video data communication systems.

16. The communication system of claim 8 wherein the synchronizing clock and serialized digital data are transmitted on a transition minimized differential signaling link.

17. A method for recovery of a synchronizing clock and serialized digital data from a received communication signal comprising the steps of:
   receiving said communication signal;
   recovering said serialized digital data from said communication signal;
   synchronizing an oscillator clocking signal to said received communication signal;
   converting said oscillator clocking signal to a plurality of multiple phased clocking signals, each signal being phase shifted from said oscillator clocking signal;
   determining if said oscillator clocking signal is in phase with said recovered serialized data and providing a lead signal and a lag signal indicating whether said oscillator clocking signal is in phase with said recovered serialized data;
   low pass filtering said lead signal and said lag signal to develop a frequency adjusting voltage for said voltage controlled oscillator; and
   receiving a reference clock signal;
   initializing said oscillator clocking signal to assist acquisition of lock of said oscillator clocking signal to said reference clock signal during initialization;
   upon initializing said oscillator clocking signal, locking said oscillator clocking signal to be synchronized to said received communication signal;
   acquiring said serialized digital data with each of said plurality of multiple phased clocking signals to create a plurality of acquired multiple phased data signals;
   selecting which of said plurality of acquired multiple phased data signals are synchronized to said plurality of multiple phased clocking signals and are to be transferred to external circuitry for further processing; and
   receiving a selection source indication signal for selecting a mode by which of plurality of acquired multiple phased data signals are selected for to external circuitry for further processing; wherein if said selection source indication signal indicates that said mode is to be a manual mode, a jitter factor of said recovered data is examined and a first grouping of said plurality of acquired multiple phased data signals is selected based on said jitter factor.

18. The method of claim 17 further comprising the steps of:
   estimating a bit error rate of said selected plurality of acquired multiple phased data signals, and
   indicating from said bit error rate transfer, whether said bit error rate is greater or lesser than a desired bit error rate.

19. The method of claim 18 further comprising the step of:
   if said selection source indication signal indicates that said mode is to be a bit error control, selecting a second grouping of said plurality of acquired multiple phased data signals as a function of said bit error rate for further processing.

20. The method of claim 17 further comprising the steps of:
   determining whether said plurality of acquired multiple phased data signals are in synchronization with said reference clock; and
   if not in synchronization connecting said low pass filter to receive said reference signal.

21. The method of claim 17 wherein said communication signal is transmitted within a communication system is selected from a group of communication systems consisting of high definition multimedia interface communication systems and digital video data communication systems.

22. The method of claim 17 wherein the synchronizing clock and reference clock are transmitted on a transition minimized differential signaling link.

* * * * *